United States Patent
Schuegraf et al.

[19]

[11] Patent Number: 6,008,086
[45] Date of Patent: Dec. 28, 1999

[54] METHOD OF DEPOSTING UNIFORM DIELECTRIC FILM DEPOSITION ON TEXTURED SURFACES

[75] Inventors: Klaus F. Schuegraf; Pierre C. Fazan, both of Boise, Id.

[73] Assignee: Micron Technology, Inc., Boise, Id.

[21] Appl. No.: 09/041,313

[22] Filed: Mar. 12, 1998

Related U.S. Application Data

[62] Division of application No. 08/547,561, Oct. 24, 1995, Pat. No. 5,801,104.

[51] Int. Cl.$^6$ ................................................ H01L 21/8242
[52] U.S. Cl. ............................................ 438/255; 438/398
[58] Field of Search .................................... 438/238–256, 438/381–399

[56] References Cited

U.S. PATENT DOCUMENTS

| | | |
|---|---|---|
| 5,043,780 | 8/1991 | Fazan et al. . |
| 5,130,885 | 7/1992 | Fazan et al. . |
| 5,138,411 | 8/1992 | Sandhu . |
| 5,149,676 | 9/1992 | Kim et al. . |
| 5,191,509 | 3/1993 | Wen . |
| 5,208,176 | 5/1993 | Ahmad et al. . |
| 5,223,734 | 6/1993 | Lowrey et al. . |
| 5,266,514 | 11/1993 | Tuan et al. . |
| 5,278,091 | 1/1994 | Fazan et al. . |
| 5,318,920 | 6/1994 | Hayashide . |
| 5,340,765 | 8/1994 | Dennison et al. . |
| 5,362,663 | 11/1994 | Bronner et al. . |
| 5,366,917 | 11/1994 | Watanabe et al. . |
| 5,376,593 | 12/1994 | Sandhu et al. . |
| 5,385,863 | 1/1995 | Tatsumi et al. . |
| 5,389,551 | 2/1995 | Kamakura et al. . |
| 5,418,180 | 5/1995 | Brown . |
| 5,429,972 | 7/1995 | Anjum et al. . |
| 5,444,013 | 8/1995 | Akram et al. . |

OTHER PUBLICATIONS

Watanabe, Title Unknown, J. Appl. Phys. 71 (7), pp. 3538–3543, 1992.
Wolf, et al. vol. 1, Silicon processing for the ULSI ERA, Lattice Press, 1986, pp. Xxiii–xxiv, 169–170, 179–180.

*Primary Examiner*—Jey Tsai
*Attorney, Agent, or Firm*—Knobbe, Martens, Olson & Bear LLP

[57] ABSTRACT

Uniformity of thin deposited layers on textured surfaces is enhanced by reducing the total surface area available to film deposition. The backside surface area of a semiconductor wafer is reduced prior to film deposition, thereby reducing the available surface to deposition when a deposition process is supply-limited. Reducing the backside surface area suppresses nonuniformities in thin film deposition when the deposition process is substantially supply-limited. The present invention is advantageous for improving uniformity of nitride capacitor dielectric layers deposited on textured electrodes.

19 Claims, 3 Drawing Sheets

METHOD OF DEPOSTING UNIFORM DIELECTRIC FILM DEPOSITION ON TEXTURED SURFACES

The present application is a divisional of application Ser. No. 08/547,561, filed Oct. 24, 1995, U.S. Pat. No. 5,801,104.

FIELD OF THE INVENTION

The invention relates generally to semiconductor integrated device fabrication. In particular, the invention pertains to deposition of films on textured surfaces, such as dielectric films deposited on textured polycrystalline silicon.

BACKGROUND OF THE INVENTION

A dynamic random access memory (DRAM) cell typically comprises a charge storage capacitor (or cell capacitor) coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance, $C=\epsilon A/d$, where $\epsilon$ is the dielectric constant of the capacitor dielectric, A is the electrode (or storage node) area and d is the interelectrode spacing. The conditions of DRAM operation such as operating voltage, leakage rate and refresh rate, will in general mandate that a certain minimum charge be stored by the capacitor.

In the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. Yet, design and operational parameters determine the minimum charge required for reliable operation of the memory cell despite decreasing cell area. Several techniques have been developed to increase the total charge capacity of the cell capacitor without significantly affecting the cell area. These include new structures utilizing trench and stacked capacitors, as well as utilizing new capacitor dielectric materials having higher dielectric constants.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant. However, it is difficult to obtain sufficient storage capacitance with a conventional STC capacitor as the storage electrode area is confined within the limits of its own cell area.

To maintain high cell capacitance in the face of small lateral cell dimensions, one technique has been to utilize so-called "textured" electrodes. A textured electrode typically comprises a polysilicon (poly) or other conductive material having an irregular or rough surface morphology. The textured surface morphology increases considerably the electrode surface area, thus increasing capacitance. For example, a typical prior art texturizing process may increase electrode area by about 2.5 times, while maintaining the same lateral profile.

A textured electrode in a cell capacitor may be processed in several ways to produce an increased surface area with respect to the available lateral dimension. For example, patterned poly or a-Si is subjected to a seeding process, whereby a desired density of incubation sites are generated. Subsequently, the seeded electrodes are annealed at temperatures which induce atomic surface migration of silicon. The incubation sites present a significantly lower local diffusivity of silicon atoms, causing local accumulation of material. The result is a textured electrode, often having a hemispherically grained morphology (Hemispherically Grained Silicon or HSG), with enhanced surface area. Such techniques are shown by way of example in T. Mine et al., "Capacitance-Enhanced Stacked-Capacitor with Engraved Storage Electrode for Deep Submicron DRAMs", Extended Abstracts of the 21st Conference on Solid State Devices and Materials, Tokyo, pp. 137–140, 1989; H. Watanabe et al., "A New Stacked Capacitor Structure Using Hemispherical-Grain (HSG) Poly-Silicon Electrodes", Extended Abstracts of the 22nd (1990 International) Conference on Solid State Devices and Materials, Sendai, pp. 873–876, 1990, Hayashide et al., "Fabrication of Storage Capacitance-Enhanced Capacitors with a rough Electrode", Extended Abstracts of the 22nd (1990 International) Conference on Solid State Devices and Materials, Sendai, pp. 869–872; Fazan et al., "Thin Nitride Films on Textured Polysilicon to Increase Multimegabit DRAM Cell Charge Capacity", IEEE Electron Device Letters, Vol. 11, No. 7, Jul. 7, 1990; Fazan et al., "Electrical Characterization of Textured Interpoly Capacitors For Advanced Stacked DRAMs"; and M. Yoshimaru et al., "Rugged Surface Poly-Si Electrode and Low Temperature Deposited Si3N4 for 64 Mb and Beyond STC DRAM Cell", Oki Electric Industry Co., Ltd., VLSI R&D Laboratory 550-1, Higashiasakawa, Hachioji, Tokyo 193, Japan.

While texturizing capacitor electrodes is advantageous from the perspective of increasing capacitance, the textured electrodes themselves present a problem when forming a thin (≈5–10 nm) conformal overlayer such as a dielectric film to serve as the interelectrode capacitor dielectric. A common problem associated with all of the aforementioned textured capacitor structures is depositing a sufficiently thin, conformal and uniform dielectric over the textured cell plates. Nonuniformities in ultra thin film dielectrics contribute to enhanced leakage current and premature dielectric breakdown. Moreover, maintaining good dielectric breakdown characteristics between the electrodes in increasingly smaller STC capacitors becomes a major concern when insulator thickness is appropriately scaled. Thus, there is increasing need in the industry for deposition processes capable of providing uniform ultrathin films overlaying textured surfaces.

SUMMARY OF THE INVENTION

One object of the present invention is to provide a method for forming a uniform ultrathin layer on a textured surface. Such layers, as for example ultrathin dielectric layers, are advantageous in DRAM memory applications where the storage capacitor electrodes have a textured surface morphology. A second object of the present invention is to provide improved thickness uniformity of dielectric layers deposited on textured surfaces. A third object of the present invention is to improve thickness uniformity control in chemical vapor deposition processes. Additional objects will become clear in view of the following disclosure.

In accordance with a first aspect of the present invention, a method of depositing a film on a semiconductor wafer having a first surface region defining a surface area and a second surface region comprises first reducing the surface area of the first surface region and then depositing the film on the second surface region. The surface area to be reduced may for example reside on the wafer backside, and is preferably reduced by etching or polishing. The method is advantageously applied to depositing uniform ultrathin dielectric layers such as silicon nitride on textured electrodes of a DRAM storage capacitor.

In accordance with a second aspect of the present invention, a process for forming a dielectric layer on a semiconductor wafer having a textured top surface region and a bottom surface region comprises first reducing the surface area of the bottom surface region, and then depositing the dielectric layer on the textured top surface region. The surface area of the bottom surface region is reduced by etching, polishing or depositing a smooth overlayer, thereby eliminating any bottom surface roughness. A preferred textured top surface comprises a textured conductor such as doped polysilicon which may be used in DRAM storage capacitors. Further, a preferred dielectric layer comprises an ultrathin silicon nitride film having a thickness of less than 10 nm and deposited by low pressure chemical vapor deposition.

In accordance with a third aspect of the present invention, a method of depositing a capacitor dielectric in a DRAM storage capacitor having a textured electrode comprises first reducing surface areas external to the textured electrode, and then depositing the capacitor dielectric on the textured electrode.

In accordance with a fourth aspect of the present invention, a method of improving semiconductor wafer throughput in a chemical vapor deposition process comprises reducing unessential surface areas on the wafers prior to the chemical vapor deposition process.

DETAILED DESCRIPTION OF THE INVENTION

The present invention is directed to improving uniformity of ultrathin deposited films, particularly when such films are deposited on surfaces having a textured morphology. Embodiments of the present invention herein disclosed pertain to processes for improving uniformity of ultrathin dielectric layers, such as silicon nitride, deposited on a textured surface such as hemispherically grained polysilicon. While the present invention is described in the context of improving thickness uniformity of a capacitor dielectric in a DRAM storage cell, it is understood that the principles of the invention and preferred embodiments thereof are applicable in other circumstances requiring uniform layers.

Figure 1:
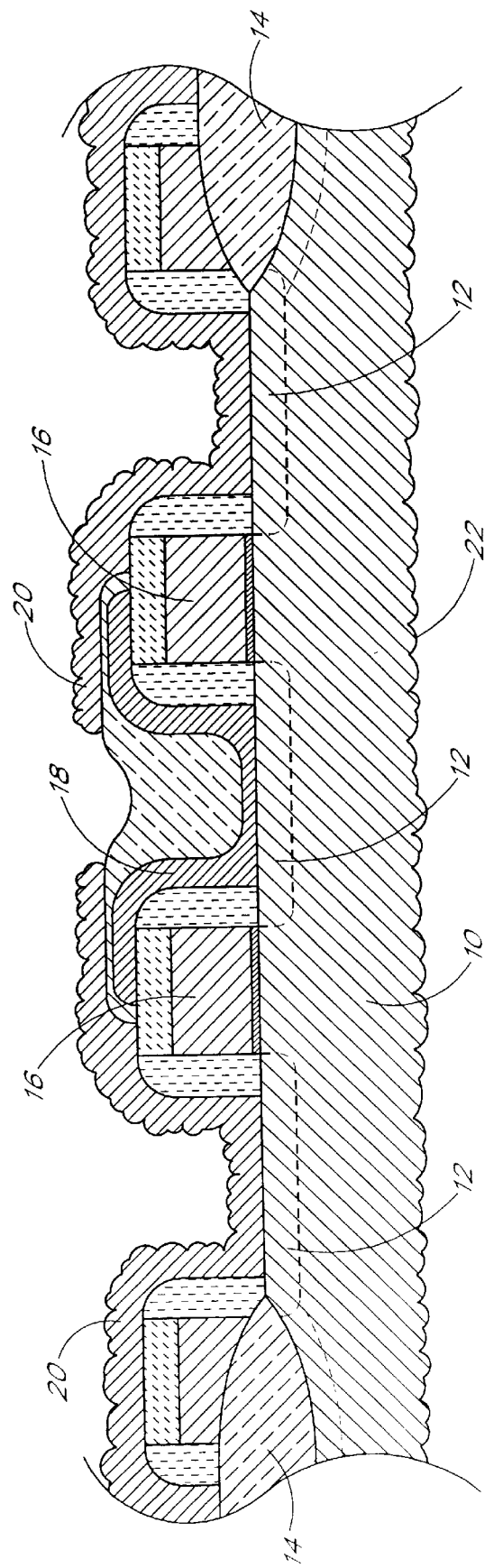
FIG. 1 is a schematic section of a DRAM storage cell having a textured storage plate processed to the point of depositing the capacitor dielectric.

A silicon wafer 10 is prepared using conventional process steps up to the point of defining an exemplary DRAM memory cell, as shown in FIG. 1. Formed on the wafer 10 are active region implants 12, field isolation regions 14, buried DRAM word lines 16 and bit line 18. The word lines 16 may for example comprise conducting poly disposed over a thin gate dielectric and isolated by vertical and horizontal dielectric spacers. The bit line may also comprise poly or some other conducting material making contact to the implant region 12. The DRAM storage nodes 20 are shown here in a stacked arrangement, coupled to both the word lines 16 and bit line 18 through the substrate 10. The storage nodes 20 are comprised of a textured conducting material such as conducting poly, which as previously described, significantly increases their surface area.

As a result of fabricating patterned and textured polysilicon structures 20 on the working side of the wafer 10, textured material 22 is often deposited on the back surface of the wafer. Furthermore, the patterning and growth processes often result in a much larger amount of textured material 22 on the back surface than that found on the working surface, thus presenting a much greater exposed area for subsequent film deposition, such as the capacitor dielectric. For high capacity DRAM applications, capacitor dielectrics are thin to provide high capacitance, but not too thin so as to create problems of leakage or premature breakdown. Dielectric thickness uniformity is carefully controlled to satisfy these constraints.

In general a preferred dielectric for DRAM capacitor applications should exhibit low electrical leakage characteristics and have a high dielectric constant. One preferred dielectric for DRAM capacitor applications is silicon nitride ($Si_3N_4$ or nitride) because of its chemical stability, imperviousness to impurity diffusion, and relatively high dielectric constant ($\eta=7.5$) relative to other known dielectrics such as silicon dioxide ($\eta=3.9$). In some cases, a nitride film may be part of a multilayer dielectric such as an oxide/nitride bilayer or oxide/nitride/oxide trilayer. By way of example, a single nitride dielectric layer is discussed herein.

High quality nitride is typically deposited in thin layers (about 5 to 10 nm) by a Low Pressure Chemical Vapor Deposition (LPCVD) of a volatile silicon complex (such as $SiCl_2H_2$) reacted with ammonia ($NH_3$) at temperatures of about 600° C. to 900° C. and pressures generally less than 1 atm.

The characteristics and quality of a LPCVD deposited nitride dielectric depends upon a number of process parameters such as temperature, temperature gradient, reactant ratio, reactant pressure, reactant throughput and available surface area for coverage. In particular, the uniformity of nitride deposition often depends upon the ability to supply reactants to all desired wafer surfaces with equal reactant flux. Variations in incident reactant flux over the wafer surface can cause thickness nonuniformities in the deposited film; moreover, excessive available surface area can often amplify the problem. For this reason, wafer throughput in a LPCVD nitride deposition may be limited by reactor geometry, reactant pressure and throughput, the combination of which is herein referred to as a supply-limited deposition.

The aforementioned problems associated with supply-limited deposition of thin nitride films is exacerbated by having an increased demand for surface coverage, for example through surfaces having a textured morphology. When the total demand for surface coverage increases, as through texturization, a supply-limited deposition process may cause an increase in intra- and inter-wafer film non-uniformities. The problem is particularly acute for ultrathin (5–10 nm) dielectric layers desirable for interelectrode capacitor dielectrics.

Figure 2:
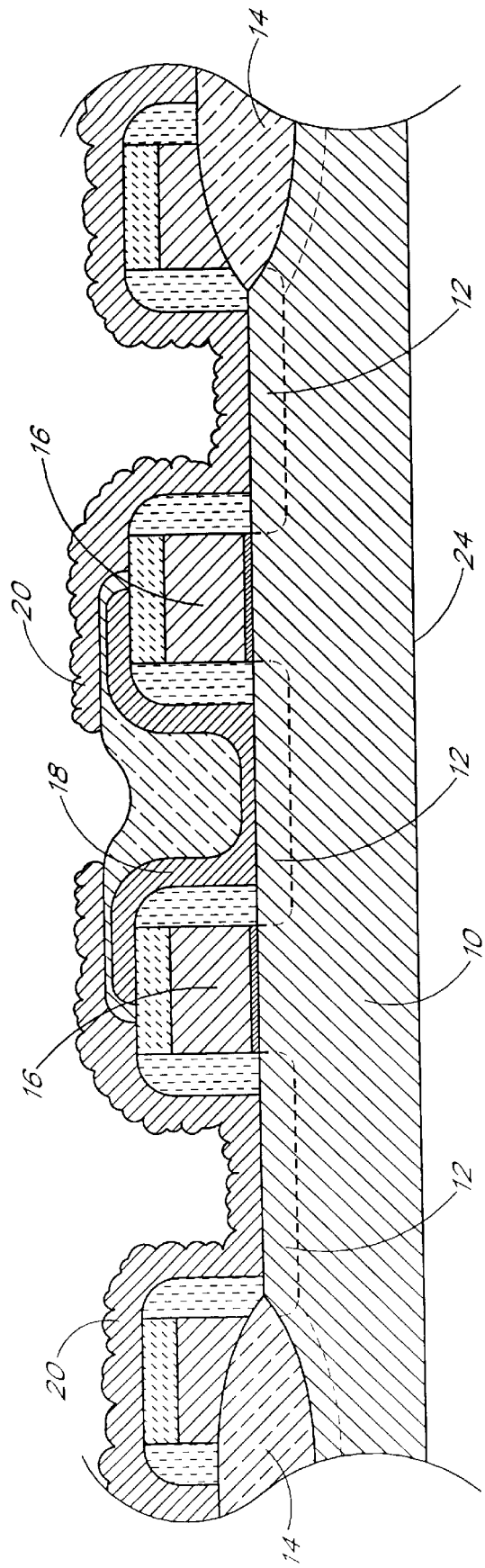
FIG. 2 is a schematic section of a DRAM storage cell with textured wafer backside deposits removed for further processing.
Figure 3:
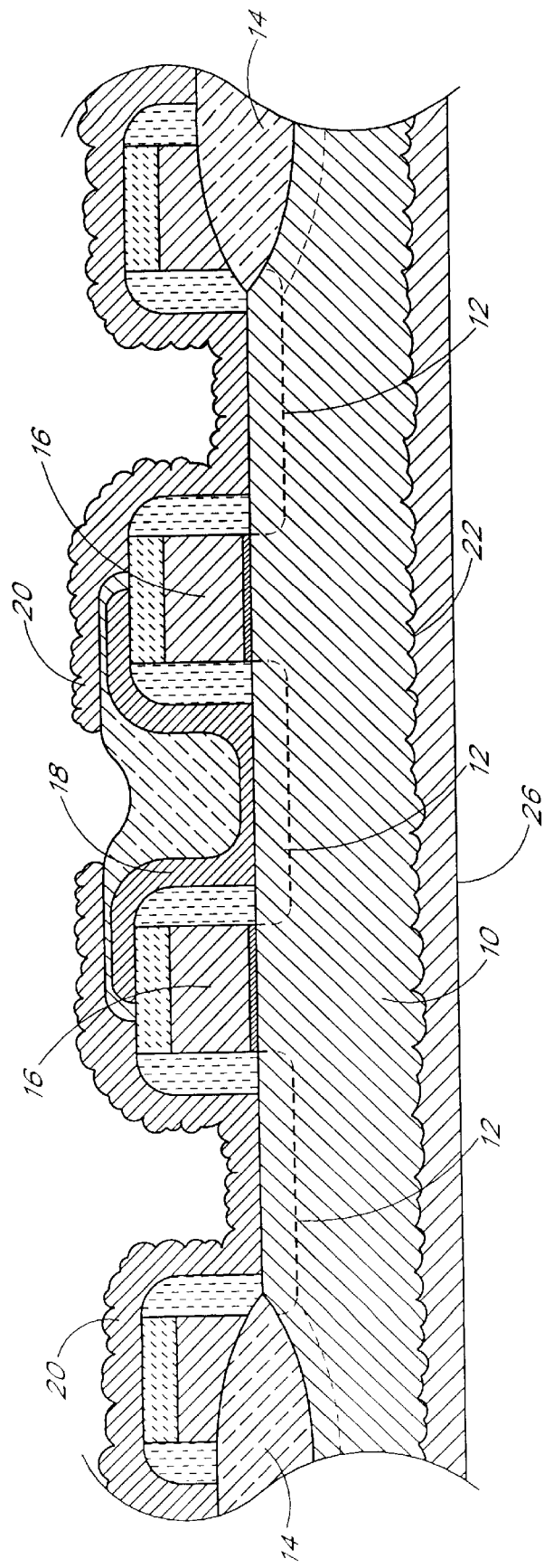
FIG. 3 is a schematic DRAM storage cell with textured wafer backside deposits covered with a planarized, passivating overcoat.

In accordance with the principles of the present invention, a process for depositing uniform layers on a region of textured surface of a semiconductor wafer comprises reducing the surface area of the wafer in regions outside of the desired deposition region. As shown in FIG. 2, one embodiment of the present invention comprises removing the textured polysilicon 22 (FIG. 1) on the back surface 24 of the wafer 10 prior to dielectric film deposition.

The exposed surface area on the backside of the wafer 10 may be reduced by etching or polishing the textured polysilicon in a manner compatible with the overall process flow. For example, the front surface of the wafer 10 may be resist coated to protect the surfaces of interest. A wet or dry etch or chemical/mechanical polish is then performed on the backside to remove polysilicon or any other textured materials, thereby lowering the overall surface area. The resist on the top surface of the wafer 10 is then removed before further processing.

As a result of removing excess textured material from the backside of the wafer 10, a smooth surface 24 presents a significantly lower net surface area for a subsequent dielectric film deposition process. The advantages of the present invention are three-fold: the subsequent thin film deposition process produces a higher degree of film uniformity; a lower net surface area during deposition allows for greater wafer throughput; and a smooth backside allows better control of dimensions in subsequent lithographic steps.

In another embodiment of the present invention, a smooth planarized layer 26 is deposited so as to overlay the textured polysilicon 22, thereby presenting a lower surface area on the wafer backside. As previously discussed, lowering the surface area of the wafer backside improves uniformity of a subsequent dielectric film, allows for higher wafer throughput during the dielectric film deposition, and provides better dimensional control in subsequent lithographic steps.

The planarized layer 26 may be a layer of polysilicon, silicon dioxide, resist or other material which is compatible with process integration, deposited for example after the front surface is resist coated. Preferably, deposition of the planarizing layer should be a relatively low-temperature process to insure compatibility with a front resist coating. Such processes may for example comprise plasma-enhanced CVD of oxide or nitride. Alternatively, a wafer deposition apparatus which isolates the wafer front surface, by for example holding the front surface adjacent to a chuck, would enable deposition of a planarizing layer on the exposed backside. Planarizing layers may additionally comprise spin coating glass or other process compatible materials.

While preferred embodiments of the present invention have been disclosed herein, those skilled in the art will appreciate that changes and modifications may be made therein without departing from the spirit and scope of the invention as defined in the appended claims.

It is claimed:

1. A method of depositing a capacitor dielectric in a DRAM storage capacitor having a textured electrode on a semiconductor substrate comprising the steps of:

smoothing a surface on a side of the substrate opposite from the textured electrode; and depositing the capacitor dielectric on the textured electrode.

2. The method of claim 1, wherein smoothing the surface comprises etching the surface.

3. The method of claim 1, wherein smoothing the surface comprises polishing the surface.

4. The method of claim 1, wherein smoothing the surface comprises depositing an overlayer on the surface.

5. The method of claim 4, wherein depositing the overlayer comprises spin coating glass.

6. The method of claim 1, wherein the textured electrode comprises textured silicon.

7. The method of claim 1, wherein the capacitor dielectric comprises silicon nitride.

8. The method of claim 7, wherein depositing the capacitor dielectric comprises a low pressure chemical vapor depositing process.

9. The method of claim 7, wherein the silicon nitride film has a thickness less than 10 nm.

10. The method of claim 1, further comprising forming a protective layer over the textured electrode prior to smoothing the surface and removing the protective layer prior to depositing the capacitor dielectric.

11. A method of forming an integrated capacitor for a memory array on a semiconductor wafer, comprising:

providing a semiconductor wafer with a conductive layer;

texturizing the conductive layer to form a textured bottom electrode on a front side of the wafer and a textured backside surface on an opposite side of the wafer;

polishing the backside surface; and depositing a dielectric film on both the polished backside surface and the textured bottom electrode.

12. The method of claim 11, wherein polishing the backside surface comprises chemical/mechanical polishing the backside surface.

13. A process for forming an integrated capacitor on a semiconductor wafer, comprising:

forming a textured electrode and a textured bottom surface region on an opposite side of the wafer from the electrode;

forming a protective coating on the textured electrode;

smoothing the bottom surface region;

removing the protective coating from the textured electrode; and depositing a capacitor dielectric layer on the textured electrode after smoothing the bottom surface region.

14. The process of claim 13, wherein the protective coating comprises a resist coating.

15. The process of claim 13, wherein smoothing comprises etching the bottom surface region.

16. The process of claim 13, wherein smoothing comprises depositing a planarized overlayer on the bottom surface region.

17. The process of claim 13, wherein depositing the capacitor dielectric layer comprises a chemical vapor deposition.

18. A method of forming an integrated circuit, comprising:

providing a semiconductor wafer having a textured electrode surface region and a discontinuous textured second surface region;

planarizing the second surface region; and conformally depositing a dielectric film on both the textured electrode surface region and the planarized second surface region.

19. The method of claim 17, wherein the textured electrode is on a front side of the semiconductor wafer, and the second surface region is on a back side of the semiconductor wafer.

* * * * *